(12) United States Patent
Doddi et al.

(10) Patent No.: US 6,636,843 B2
(45) Date of Patent: Oct. 21, 2003

(54) SYSTEM AND METHOD FOR GRATING PROFILE CLASSIFICATION

(75) Inventors: Srinivas Doddi, San Jose, CA (US); Nickhil Jakatdar, Fremont, CA (US); Xinhui Niu, San Jose, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 467 days.

(21) Appl. No.: 09/737,705

(22) Filed: Dec. 14, 2000

(65) Prior Publication Data

US 2002/0188580 A1 Dec. 12, 2002

(51) Int. Cl.[7] .................................................. G06N 5/02
(52) U.S. Cl. ........................... 706/46; 706/12; 706/934
(58) Field of Search ........................... 706/46, 12, 934; 707/100

(56) References Cited

U.S. PATENT DOCUMENTS 5,982,891 A * 11/1999 Ginter et al. .................. 705/54

OTHER PUBLICATIONS

T. Feder, et al, Optimal Algorithms for Approximate Clustering, 1988, ACM, Proceedings of the 20th ACM Symposium on Theory of Computing, 434–444.*

T. Feder, et al., "Optimal Algorithms for Approximate Clustering", Proceedings of the 20th ACM Symposium on Theory of Computing, pp. 434–444, 1988.

T. Gonzalez, "Clustering to Minimize the Maximum Intercluster Distance", Theoretical Computer Science, vol. 38, pp. 293–306, 1985.

S. Kirkpatrick, et al., "Optimization by Simulated Annealing", Science 220, 4598 (May), pp. 671–680, 1983.

* cited by examiner

Primary Examiner—Paul P. Gordon
Assistant Examiner—Joseph P. Hirl
(74) Attorney, Agent, or Firm—Morrison Foerster LLP

(57) ABSTRACT

Grating profile data is classified using a cluster generator to generate a plurality of clusters of grating profile data points from a data space containing grating profile data points. The cluster generator associates profile shape data to each cluster, and links the associated profile shape data to the grating profiles belonging to each cluster.

11 Claims, 9 Drawing Sheets

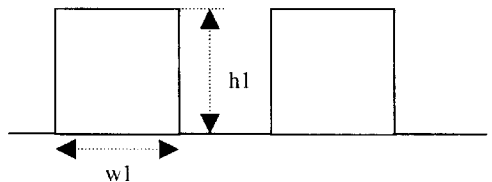

Rectangular Profile
Bottom width---- w1
Height ---------- h1

FIGURE 1A

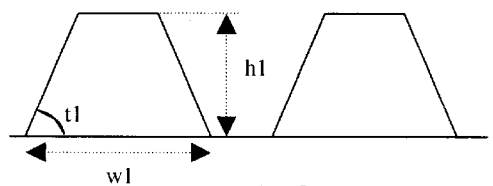

Trapezoidal Profile
Bottom width---- w1
Height ---------- h1
Sidewall angle -- t1

FIGURE 1B

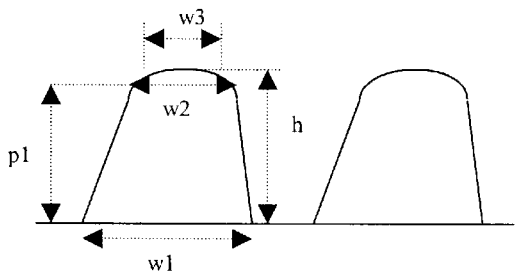

Trapezoidal with Top Rounding Profile
Trapezoidal bottom width-------- w1
Trapezoidal top width ------------ w2
Total height ----------------------- h
% height of top rounding -----(p1/h)*100
Rounding top width -------------- w3

FIGURE 1C

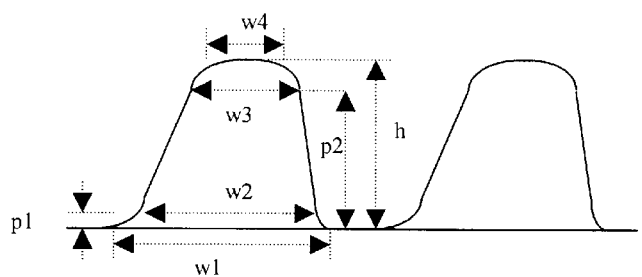

Trapezoidal with Top Rounding Profile
and Bottom Footing
Footing bottom width ------------ w1
Trapezoidal bottom width-------- w2
% height bottom foot ----- (p1/h)*100
Total height ----------------------- h
% height of top rounding --- (p2/h)*100
Trapezoidal top width ------------ w3
Rounding top width -------------- w4

FIGURE 1D

| Time, HH:MM | Top Width / Bottom Width | Total Height / Top Width | Top Width, nm | ... | Profile Label | Profile Graphic Image | Alert |
|---|---|---|---|---|---|---|---|
| 10:00 | 1.20 | 0.90 | 1.000 | .. | Trapezoid Round A | Bit Map TA | |
| 11:00 | 1.16 | 0.97 | 0.920 | ... | Trapezoid Round C | Bit Map TC | |
| 12:00 | 1.13 | 1.10 | 0.850 | ... | Trapezoid Round E | Bit Map TE | |
| 13:00 | 1.05 | 1.25 | 0.785 | ... | Trapezoid Round F | Bit Map TF | |
| ... | ... | ... | ... | ... | ... | ... | ... |
| 15:00 | 0.85 | 1.38 | 0.650 | ... | Trapezoid Round R | Bit Map TR | |
| 16:00 | 0.75 | 1.45 | 0.484 | ... | Trapezoid Round S | Bit Map TS | *OUTSIDE OF RANGE!* |
| (300) | (310) | (320) | (330) | | (340) | (350) | (360) |

*FIGURE 9*

SYSTEM AND METHOD FOR GRATING PROFILE CLASSIFICATION

CROSS-REFERENCE TO RELATED APPLICATIONS

This application relates to co-pending U.S. patent application Ser. No. 09/727,531, entitled "Clustering For Data Compression" by Doddi, Srinivas filed on Nov. 28, 2000, owned by the assignee of this application and incorporated herein by reference.

BACKGROUND OF INVENTION

1. Field of Invention

Invention relates to measurements and evaluation of grating profile dimensions and more particularly to the characterization, classification, and use of grating profile data.

2. Description of Related Art

Spectroscopic reflectometry and ellipsometry are used to beam light on a grating and measure the spectra of reflected signals. Current practices basically use an empirical approach where the spectra of reflected light is measured for a known width of features in a grating, a time consuming and expensive even for a limited library of profiles. If such a library were built using either empirical or calculated spectrum data, the library would be very useful to have in a real-time environment. A grating profile library of feature dimensions and spectrum data could be used for matching against input grating spectrum data from metrology devices and get the grating dimensions associated with the matching library profile.

However, manufacturers are not only interested in the basic measurements of the grating dimensions but also in the shape of the grating features. If the shape of the grating features were correlated to the fabrication variables, manufacturers would have information upon which to base corrective actions. Knowledge of the grating shapes and other characterizations of the grating profile are also important in evaluating the acceptability of gratings. Thus, there is a need to associate profile shape data to a profile. Although possible, manual labeling of a typical run-time profile library of about 400,000 to 500,000 profiles is a time consuming and expensive task. The characterization and classification of library profiles should be done in a way that solves the laborious tasks of inputting profile shape data. Once an efficient way of characterizing the profiles is available, profile library data and statistical measurements may be used to define acceptable ranges and tolerances in the grating profile dimensions and shapes.

SUMMARY OF INVENTION

The invention resides in a method and a system of characterizing a data space of grating profile data such as a grating profile library. In one embodiment, the method for characterizing grating profile data comprises requesting classification of a grating profile data space consisting of grating profile data points, clustering the grating profile data points into a number of clusters, and associating profile shape data to each cluster. Profile shape data comprise a profile shape label, a profile shape graphical image, and a profile shape description.

One system for classifying grating profile data comprises a grating profile data space containing grating profile data points; a computer; and a cluster generator for generating a plurality of clusters of grating profile data points from the data space containing grating profile data points by utilizing a clustering algorithm, for associating profile shape data to each cluster, and for linking the associated profile shape data to the grating profile data points belonging to each cluster.

In one embodiment, the present invention includes a method for evaluating grating profile data by accessing profile data from a grating profile library instance selected as the closest match to an input grating profile; comparing the profile data from the grating profile library instance with a set of acceptable ranges of profile data for the application; flagging the input grating profile if the profile data is outside the set of acceptable ranges of profile data for the application; and presenting the profile data and flags associated with the grating profile. Presentation of the profile data and flags includes a display of a profile shape image and or a two-dimensional graph of key profile dimensions, and an alert identifying the profile shape data as exceeding the acceptable parameter ranges.

The present invention further includes in one embodiment a system for evaluating grating profile shapes. The system comprises a computer; a profile cluster database for storing the profile shape data for a cluster of profiles; a library of grating profiles; and a profile shape evaluator; where the profile shape evaluator accesses the profile shape data from a grating profile library instance selected as the closest match to an input grating profile, compares the profile shape data with a set of acceptable ranges of profile data for the application, and flags the input grating profile if the profile shape data is outside the set of acceptable ranges of profile data for the application.

BRIEF DESCRIPTION OF DRAWINGS

FIGS. 1A–1D are cross-sectional diagrams illustrating various grating profiles and key dimensions of grating features.

FIG. 9 is a display format for using the profile classification data to signal an alert due to a drift in grating profile dimensions, in one embodiment of the present invention.

DETAILED DESCRIPTION OF PREFERRED EMBODIMENT(S)

FIG. 1A to FIG. 1D are cross-sectional diagrams illustrating various profiles and key dimensions of grating features. FIG. 1A is a cross-sectional diagram of a grating with a rectangular profile, illustrating the feature bottom width w1 and the feature height h1. FIG. 1B is a cross-sectional diagram of a grating with a trapezoidal profile, illustrating the feature bottom width w1, the feature height h1, and the sidewall angle t1. FIG. 1C is a cross-sectional diagram of a grating with a trapezoidal profile with top rounding, illustrating the feature trapezoidal bottom width w1, the trapezoidal top width w2, total height h, the rounding top width w3, and the height prior to the top rounding p1. A key dimensional statistic for the trapezoidal with top rounding profile is the percent height of top rounding, calculated by the formula: (p1/h)*100. FIG. 1D is a cross-sectional diagram of a grating with a trapezoidal profile with top rounding and bottom footing, illustrating the feature footing bottom width w1, the trapezoidal bottom width w2, the total height h, the trapezoidal width w3, and the rounding top width w4. Two key dimensional statistics for the trapezoidal with top rounding and bottom footing are percent height bottom foot, calculated with the formula: (p1/h)*100; and percent height of top rounding, calculated with the formula: (p2/h)*100.

Some applications may include other profile measurements to account for T-topping, rounding, undercut, concave sidewalls, convex sidewalls, and the underlying thickness.

Figure 2:
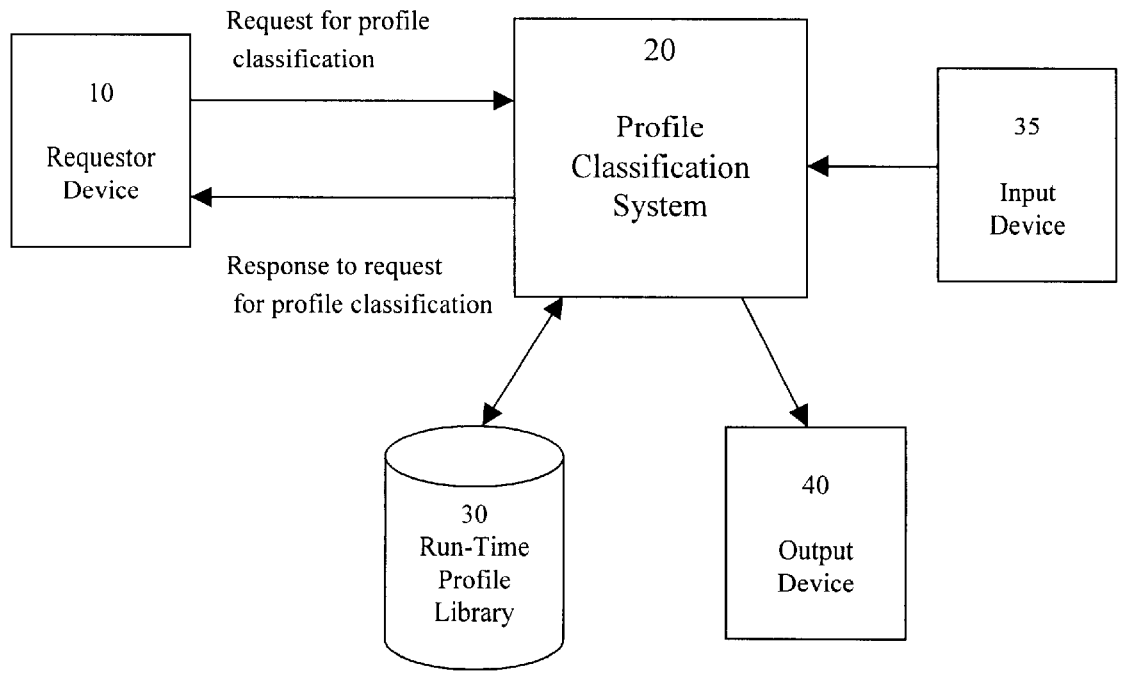
FIG. 2 is an architectural diagram illustrating a profile classification system according to one embodiment of the present invention.

FIG. 2 is an architectural diagram illustrating a profile classification system according to one embodiment of the present invention. A requestor device 10 issues a request for profile classification of a grating profile data space consisting of profile data points. The request for profile classification may include a parameter specifying the number of clusters for the grating profile data space. The grating profile data space is populated by instances from a run-time profile library 30 containing profile dimensions and associated calculated spectrum data. Spectrum data are optical broadband signals involving multiple wavelengths, each represented by a vector of for example, over 100 components, commonly obtained from the digitized measurements of the reflected light from a grating. Calculated spectrum data is derived by solving a rigorous mathematical model of the reflected light from a grating with a given set of dimensions. A run-time profile library 30 includes only the range of profile instances expected in a manufacturing run and is a subset of the bigger master profile library generally used to encompass the whole range of grating profiles for a manufacturing site.

The profile classification system 20 may use one of a variety of clustering algorithms, such as k-means, k-median, and k-center. The most appropriate for this application is the k-center clustering method. However, like the other clustering methods, k-center is difficult to solve. To address this problem, a heuristic that generates a probable near-optimal solution is used. One such heuristic is described in a journal article by T. Gonzalez, "*Clustering to Minimize the Maximum Intercluster Distance*", Theoretical Computer Science, Volume 38, pp. 293–306, (1985), (referred to herein as Gonzales algorithm), which is incorporated by reference. One embodiment of the present invention uses the Gonzales algorithm.

The result of the classification process is a profile cluster file stored in an output device 40. A profile cluster is also known as a primitive, being that the group of profiles in a cluster corresponds to a primitive shape, such as a trapezoidal profile, T-topping profile or a rectangular profile. The input device 35 is used to enter profile shape data associated with each profile cluster record. Profile shape data comprise profile label, profile graphical image, and profile description. Examples of profile shape data is illustrated and discussed in FIG. 3. Input device 35, output device 40, and or requester device 10 may be separate units or housed in the same unit, co-located with profile classification system 20 or may be located at remotely distributed locations.

Figure 3:
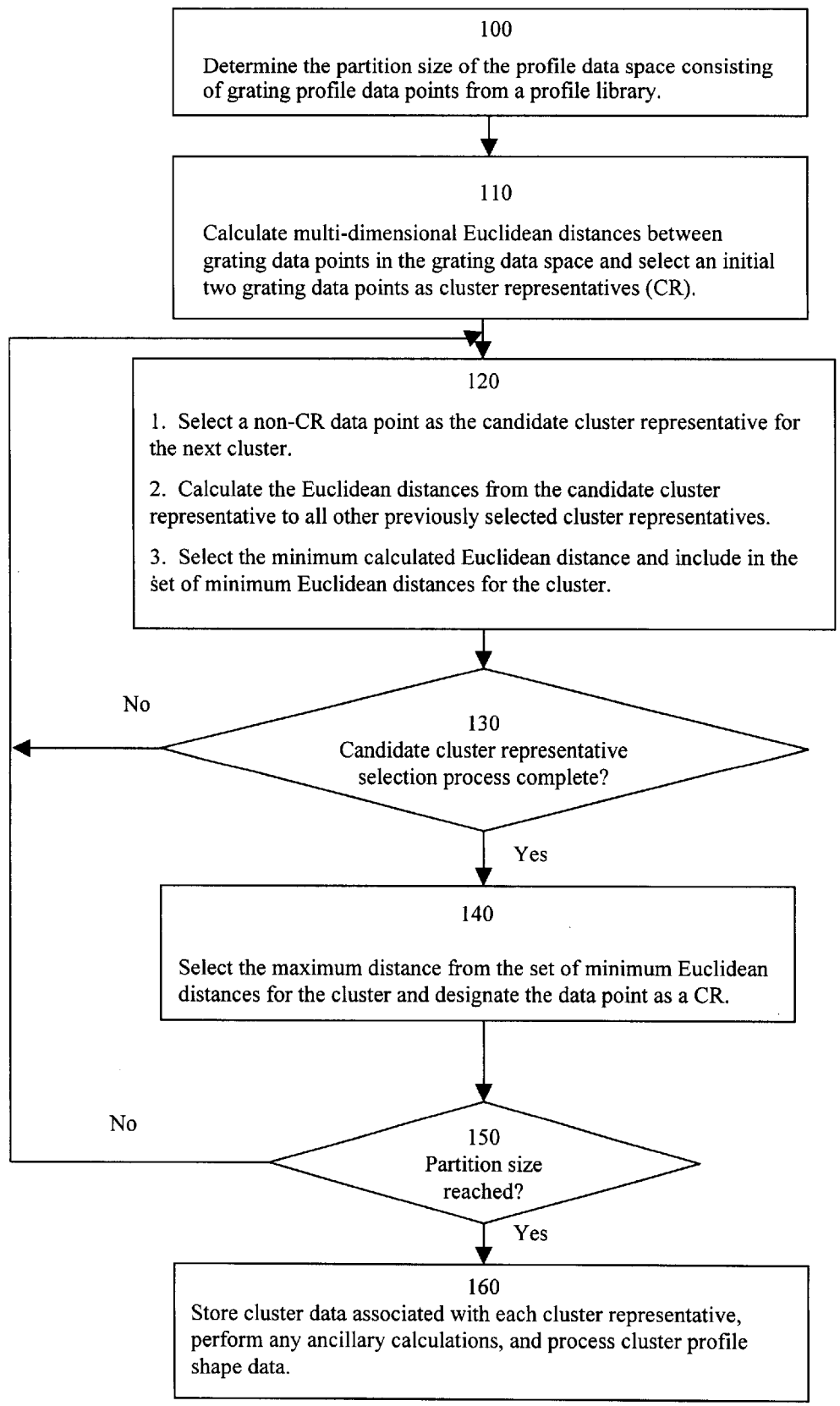
FIG. 3 is flow chart of the steps in classifying the grating profiles, according to one embodiment of the present invention.

FIG. 3 is flow chart of the steps in classifying the grating profiles, according to one embodiment of the present invention. Classification of grating profiles may be done by clustering the profiles or by software implementing program logic using the rules of construction for compiling the profile library from a set of parameters, classifying the profile library using these same rules. Where classification of grating profiles is by clustering, the partition size for the data space consisting of instances of the grating profile library is first determined 100. The partition size is the number of clusters for the data space of grating profiles. Determination of partition size may be done by entering a partition size based on empirical data for a given application. In one embodiment, the partition size is specified from a client-supplied table of partition sizes. The default partition size is two.

Alternatively, the partition size may be determined by software implementing the "null hypothesis" concept. A book written on the subject of null hypothesis, incorporated by reference, include "Algorithms for Clustering Data", A. K. Jain and R. C. Dubes, Prentice Hall, 1988.

The optimal maximum radius for clusters in a data space may be determined by applying the Min-Max Rule, which in pertinent part is as follows: "for any representative cluster data points in a set $S_i$ (where $1 \leq i \leq K$, with K equal to the partition size), assuming the original set will be entirely partitioned into sets $\{S_1, S_2, \ldots S_k\}$, the maximum number of sets that to original set S will be partitioned into minimizes the maximum radius formed by the representative cluster data point of any cluster of set $S_i$." However, solving for the optimal "maximum radius" is a computationally difficult problem. Computation with the best known algorithms are lengthy and varies exponentially with the number of partitions. In one embodiment, the Gonzales algorithm is used as the clustering algorithm. A non-hierarchical partitioning method, the Gonzales algorithm yields a radius that is within the optimal maximum radius by no more than two times the optimal maximum radius. A thorough discussion of the implementation of the Gonzales algorithm for a similar application is included in the above-referenced co-pending application, included here by reference, entitled "Clustering For Data Compression", by Doddi, Srinivas filed on Nov. 28, 2000.

Next, the multi-dimensional Euclidian distances between data points in the data space is calculated and an initial set of two data points is selected as cluster representatives (CR) 110. Data points are the grating profile instances of the grating profile library. The Euclidean distance (ED) between points "X" and "Y" in multi-dimensional space can be represented by the vector difference $ED_{YX}=<Y>-<X>$, or, $$ED = \sqrt{(y_1 - x_1)^2 + (y_2 - x_2)^2 + (y_3 - x_3)^2 + \ldots + (y_n - x_n)^2}$$

where the coordinate description for a given point "X" can be designated by a multi-dimensional vector <X> in hyper dimensional N-space, can be given as $<X>=<x_1, x_2, x_3 \ldots x_n>$ and a second point "Y" can be designated by a multidimensional vector <Y>likewise as $<Y>=y_1, y_2, y_3 \ldots y_n>$.

After calculating the Euclidian distances, a non-cluster representative data point is selected as the candidate cluster representative of the next cluster; the Euclidian distances between the candidate cluster representative and all other previously selected cluster representatives are calculated; and the minimum calculated Euclidian distance is chosen and included in the set of minimum Euclidian distances for the cluster 120. If the candidate cluster representative selection process for a cluster is not complete 130, i.e., there are more data points in the data space, repeat the previous step 120. Otherwise, select the maximum Euclidian distance from the set of minimum Euclidian distances for the cluster and designate the data point as a cluster representative 140. If the partition size has not been reached 150, proceed to step 120 and go through the process for selecting another cluster representative. Otherwise, store the cluster data associated with each cluster representative into all library profile records included in the cluster, perform any ancillary calculations, and process profile shape data 160, such as profile cluster label, profile cluster graphical image, and profile cluster description. Ancillary calculations include any optional computations can be performed, such as, error checking or other optional software routines.

For example, a grating profile library may have 500,000 individual profiles. Each grating profile contains feature dimensions, underlying thickness, and calculated spectrum data. Attaching a meaningful profile label that characterizes the profile shape of the 500,000 profiles is a tedious and expensive task. If the clustering process illustrated in FIG. 3 resulted in a ratio of 100 profiles to one cluster, then only the 5,000 clusters need to have a profile label and other profile shape data. The 100 profiles belonging to a cluster would share the same profile label. Table 1 shows an example of the results of the clustering process where the first 100 profile instances of the grating profile library belong to cluster 1 with a profile label of "Trapezoid A" and the next 100 profile instances of the grating profile library belong to cluster 2 with a profile label of "Trapezoid B". Table 2 shows the first three and the last two records of a cluster file comprising 10,000 cluster records.

Figure 4:
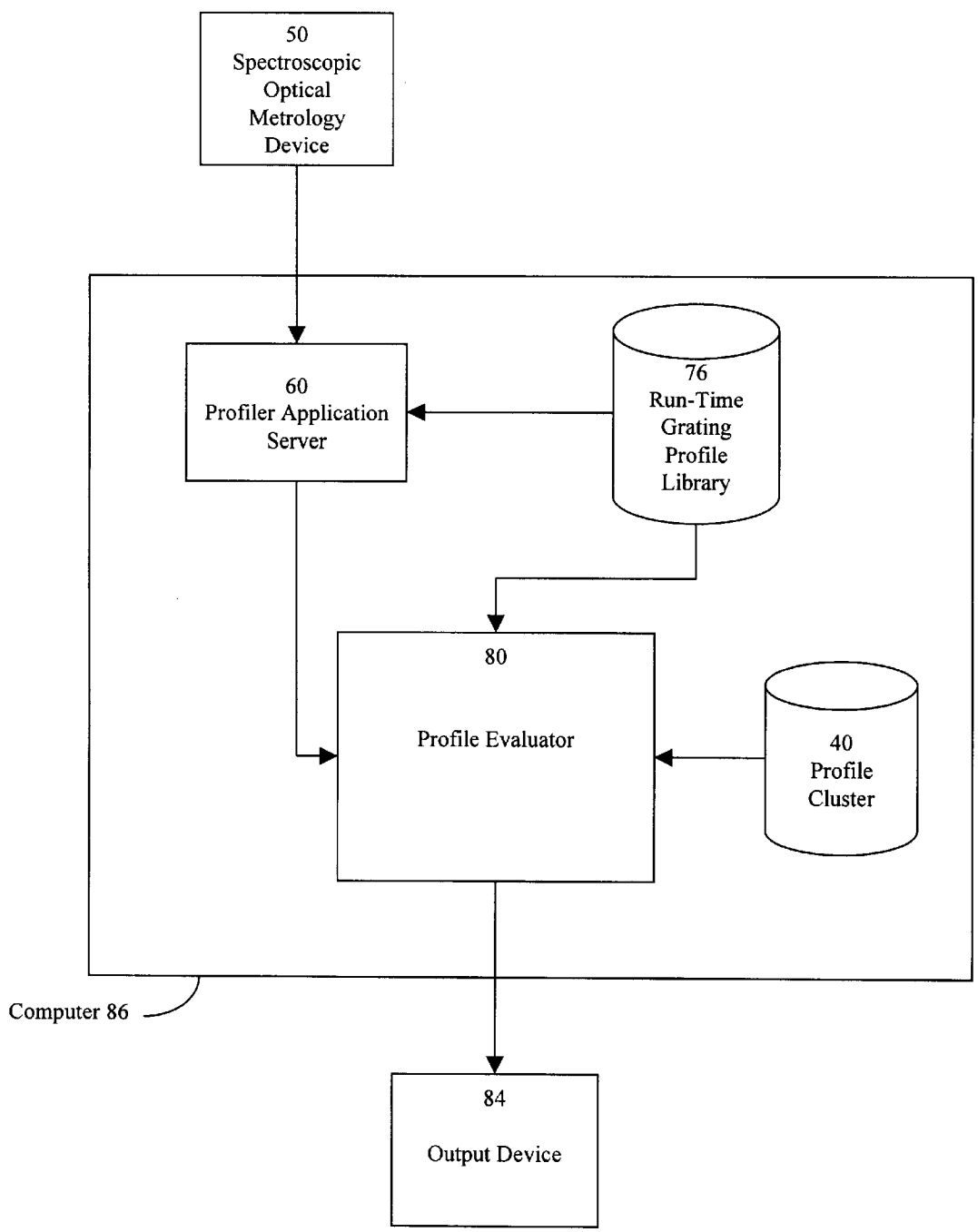
FIG. 4 in an architectural diagram of an application utilizing profile classification data to evaluate grating profiles, in one embodiment of the present invention.

FIG. 4 in an architectural diagram of an application utilizing profile classification data to evaluate grating profiles, in one embodiment of the present invention. A spectroscopic optical metrology device 50 provides grating spectrum data to profiler application server (PAS) 60. The profiler application server 60 accesses the run-time library 76 to compare the calculated spectrum data from instances of the run-time profile library 76 with the spectrum data from the spectroscopic optical metrology device 50. The profiler application server 60 finds the closest match of the grating spectrum data to the calculated spectrum data from the run-time profile library 76 instance, creates a grating profile log that is either transmitted to the profile evaluator 80 for immediate real-time evaluation or for later batch processing. The closest-match library calculated spectrum data is one that minimizes the error between the grating spectrum data and the library calculated spectrum data. The error metric that produces appropriate results is the sum-squared-difference error metric, where the optimization procedure minimizes the error metric between the grating spectrum data and the library calculated spectrum data. In one embodiment, the sum-square-difference-log error metric is used. The profile evaluator 80 accesses the profile cluster 40 using the profile label from the grating profile log and extracts all the profile shape data associated with the cluster. The profile evaluator 80 compares the profile shape data and profile dimensions with corresponding acceptable ranges for the application and creates display data on the output device 84.

Figure 5A:
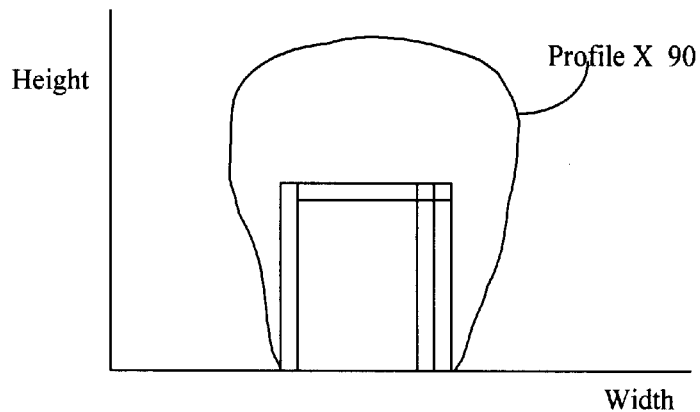
FIG. 5A is two-dimensional graphical view illustrating a distribution of rectangular grating profiles and a stray undercut profile.

FIG. 5A is two-dimensional graphical view illustrating a distribution of rectangular grating profiles and a stray undercut profile. Visually, profile X 90 has a significantly larger top width compared to its bottom width and the total height is much bigger than the top width. For obvious stray profiles like profile X 90, the presence of a graphical image of a grating profile alone enables one to spot the deviation of a grating profile from the average-dimension profile during fabrication.

Figure 5B:
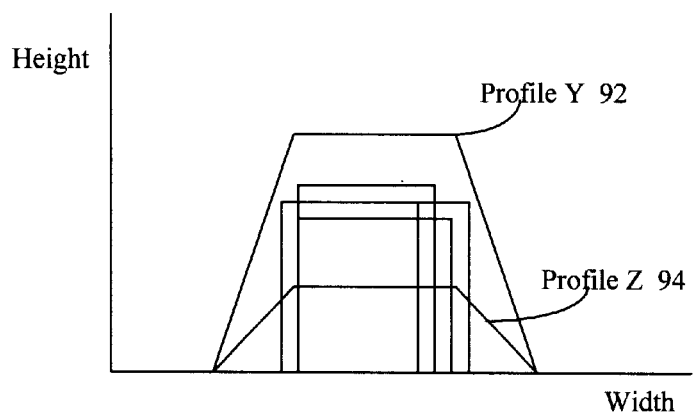
FIG. 5B is two-dimensional graphical view illustrating a distribution of rectangular grating profiles and stray trapezoidal profiles.

FIG. 5B is two-dimensional graphical view depicting a distribution of rectangular grating profiles and stray trapezoidal profiles. Profile Y 92 and profile Z 94 both stand out from the majority of other profiles. Profile Y 94 is a trapezoidal profile with a large bottom width while profile Z 94 has the same bottom width but a lower total height. If the differences between the stray profiles compared the average profile in a manufacturing run is pronounced, these stray profiles are easy to spot. However, if the variations are small but enough to push the grating outside the acceptable dimension ranges, visual verification may not be sufficient. A quantified and graphical measure of the variance is needed.

Figure 5C:
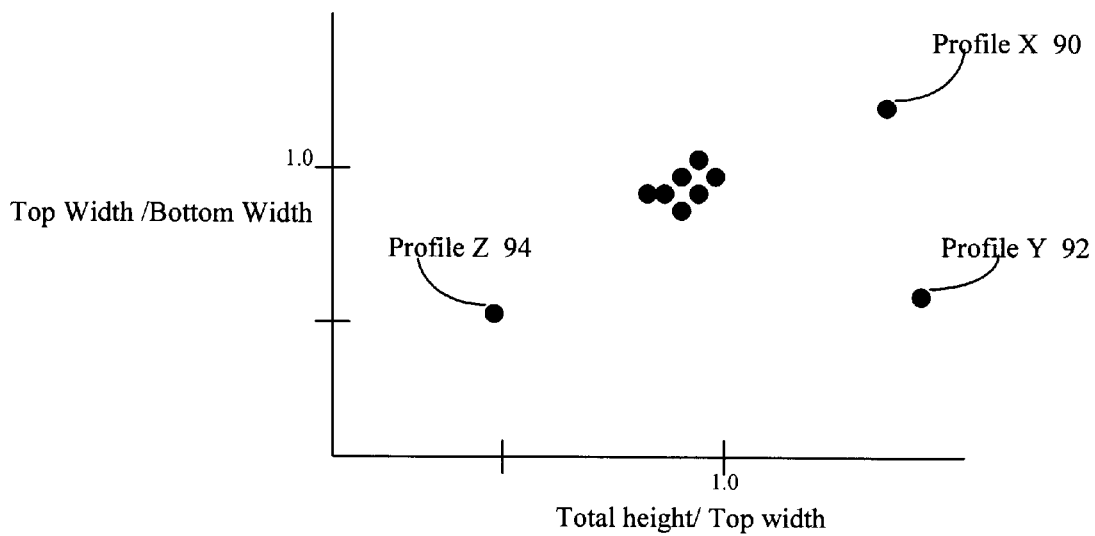
FIG. 5C is a two-dimensional graph of ratios of key grating feature dimensions illustrating the divergence of stray profiles from the average profiles.

FIG. 5C is a two-dimensional graph of ratios of key grating feature dimensions illustrating the divergence of stray profiles from the average profiles. The ratio of the top width to the bottom width is used as the X axis and the ratio of the total height to the top width is used as the Y axis. The majority of the profiles shown in the graph as dots closely packed together have both the ratios close to 1. Profile X 90 stands out as a profile with both ratios higher that 1, profile Y 92 stands out as profile with a top width/bottom width ratio close to 0.5 and total height/top width ratio exceeding 1, and profile Z 94 stands out where both the ratios are close to 0.5. Graphically presented as in FIG. 5C, grating profile data and their profile labels can be used effectively to highlight stray profiles and drifting profile dimensions during a manufacturing run. Different ratios may be used instead of the two ratios discussed above. Other statistical measures for showing a variance from an acceptable range may be employed and still stay with the principles and methods of the present invention.

Figure 6A:
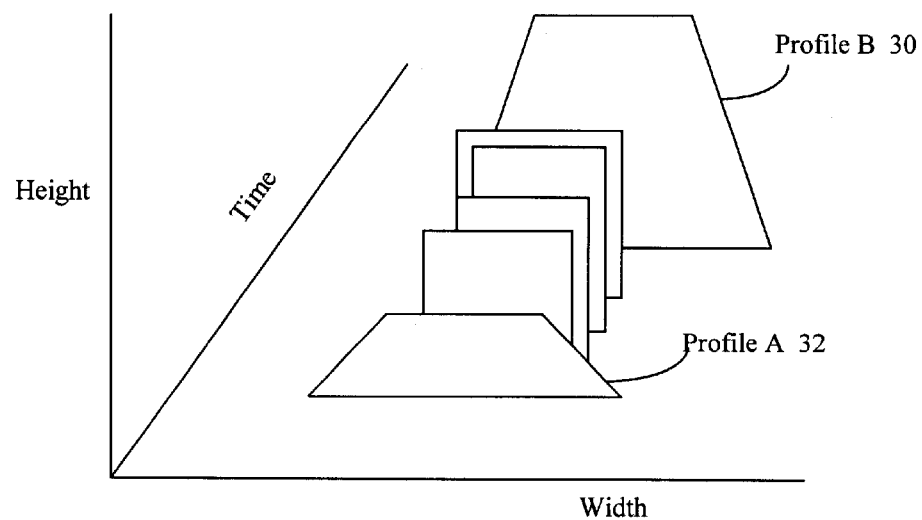
FIG. 6A is a two-dimensional graphical view of grating profiles fabricated at different times during a manufacturing run.
Figure 6B:
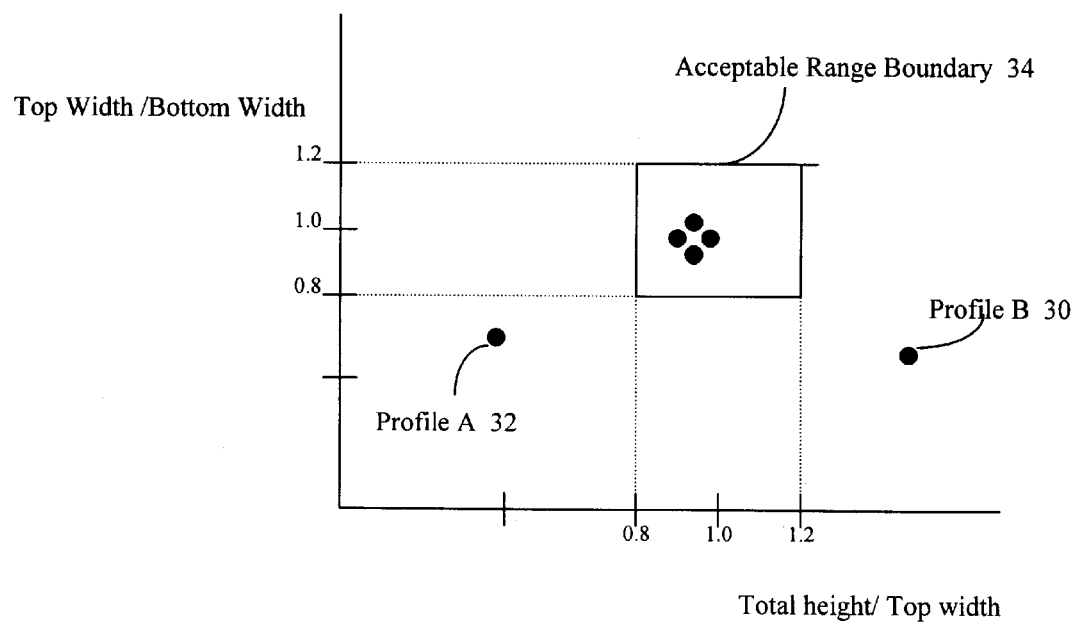
FIG. 6B is a graphical representation of the profile shape data expressed as critical dimension ratios in relation to acceptable ranges of the critical dimension ratios.

FIG. 6A is a two-dimensional graphical view of grating profiles fabricated at different times during a manufacturing run. If the application established a range of acceptable profiles to only rectangular and trapezoidal shapes with a top width to bottom width ratio of 0.8 to 1.2 and a total height to top width ratio of 0.8 to 1.2, profile A 32 and profile B 30 would be flagged as outside the acceptable ranges. FIG. 6B is a graphical representation of the profile shape data, expressed as critical dimension ratios, and the acceptable ranges of the same critical dimension ratios. In this example, the acceptable range boundary is shown as a rectangle enclosing the upper and lower ranges of both ratios; however, the boundary may be expressed as a circle or a sphere in a three dimensional setting or a radius from a reference point. Profile A 32 and profile B 30 graphically show that these profiles are outside the acceptable range boundary and would be flagged. In one embodiment, the presentation of the profiles shapes and flags is through a monitor showing both FIG. 6A and or FIG. 6B where profile A 32 and B 30 may be shown in a different color or a flashing symbol. Alternatively, flags of profile A 32 and profile B 30 may be converted to standardized video and audio alerts, based on application implementation options selected by the client.

Figure 7A:
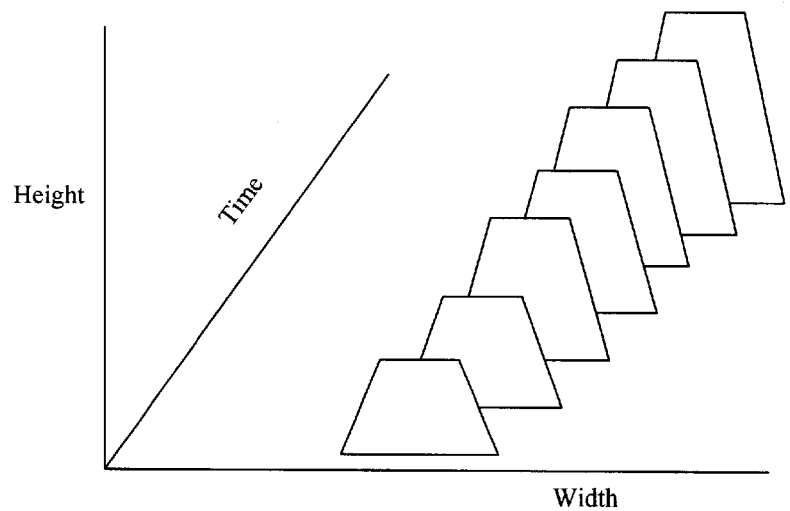
FIG. 7A is a two-dimensional graphical view of grating profiles fabricated at different times during a manufacturing run.
Figure 7B:
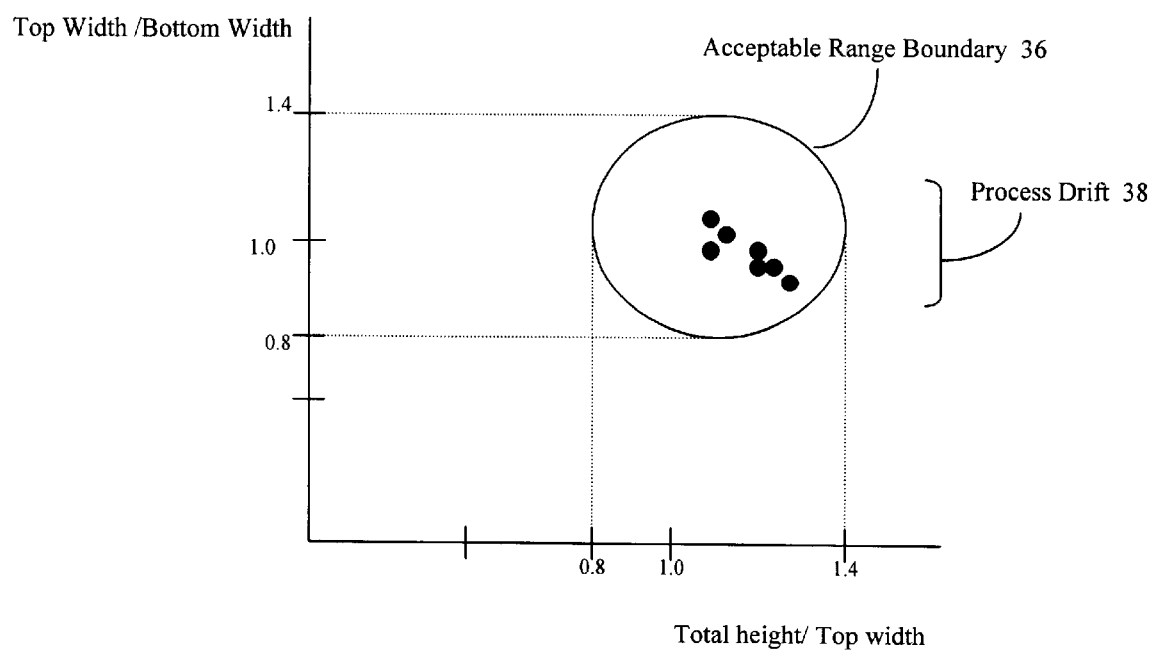
FIG. 7B is a graphical representation of the profile shape data expressed as critical dimension ratios in relation to acceptable ranges of the same critical dimension ratios, the acceptable ranges expressed as a set of values within a circular boundary.

FIG. 7A is a two-dimensional graphical view of grating profiles fabricated at different times during a manufacturing run. If the application established a range of acceptable profiles to trapezoidal shapes with a top width to bottom width ratio of 0.8 to 1.2 and a total height to top width ratio of 0.8 to 1.4 none of the grating profiles would be flagged since the profile shapes are all within the acceptable ranges. FIG. 7B is a graphical representation of the profile shape data expressed as critical dimension ratios and the acceptable ranges of the same critical dimension ratios, the acceptable ranges expressed as a set of values within a circular boundary. The acceptable range boundary is shown as a circle enclosing the upper and lower ranges of both ratios. Although all the gratings are still within the acceptable range boundary, it is apparent that the shape and dimensions of the grating features are drifting to the acceptable range boundary. Visual inspection of the display would give manufacturing personnel an early warning to enable determination of the causes of the process drift and rectification if necessary. Similar video and audio alerts may be activated whenever process drift causes profile dimensions to exceed or get close to the acceptable range boundary, based on implementation options selected for the application.

Figure 8:
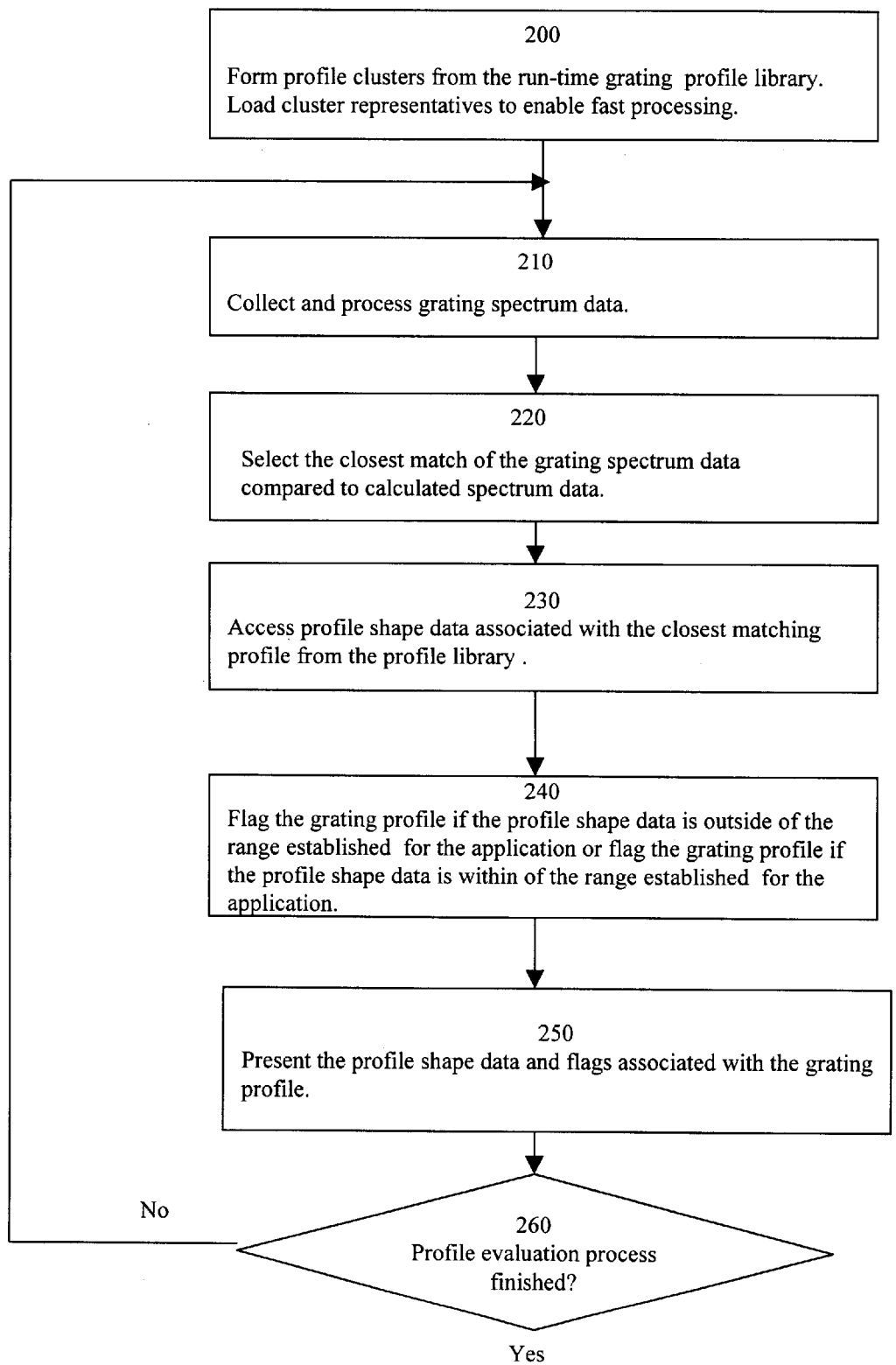
FIG. 8 is a flow chart of the process for searching the closest matching library profile instance to the input grating spectrum data and for evaluating acceptability of a grating, in one embodiment of the present invention.

FIG. 8 is a flow chart of the process used in searching for the closest matching library profile to spectrum data of a grating, in one embodiment of the present invention. Initially, profile clusters are formed from the run-time profile library, described in FIGS. 2 and 3, and these profile clusters are loaded for fast processing 200. Generally, the formation of the profile clusters is done in a separate computer run due to potential lengthy processing involved. Loading of the profile clusters for fast processing may be done by loading the profile clusters into memory or by any means to enable quick lookup of the profile clusters and for real-time usage.

Next, the grating spectrum data is collected and processed 210. The grating spectrum data is collected from spectroscopic optical metrology devices and processed to make the spectrum data available for real-time or batch use. The closest match of the grating spectrum data compared to the calculated spectrum data from the profile library is selected 220. Next, the profile shape data associated with the closest matching profile from the profile library is accessed 230. The profile shape data comprise a profile label, a graphical image, and or description of the shape. For example, the profile shape data for a grating may be "Trapezoid Ftng A", a bit map or a computer generated image or digitized drawing graphically depicting the profile shape, and description of the shape as "Trapezoid, total height is 2× bottom width, rounded top, footing A."

The grating profile is flagged if the profile shape data is outside the range of acceptable profiles established for the application 240. The range of acceptable profiles may specify only rectangular or trapezoidal profiles, i.e.; T-topped or undercut profiles are not acceptable. Alternatively, a similar shape profile but outside a certain range of predetermined dimensions may also not be acceptable. For example, a trapezoidal profile with top rounding and bottom footing that has a percent height of top rounding, ((height of footing/total height)*100), greater than 10% may be outside the range of acceptable profiles. Next, the profile shape data and flags associated with grating profiles are presented 250. In one embodiment, the range of acceptable profile key dimensions is defined in terms of a boundary. Presentation of the profile shape data and flags may be through a display such as a monitor display screen, a report, and or a video or audio alert. For example, an audio alert may be sounded when the profile shape of the gratings during a fabrication run exceeded the acceptable ranges by a predetermined amount or a percentage. If the processing of input grating spectrum data is not finished 260, the flow proceeds to collection and processing step 210, else terminate the task.

FIG. 9 is a display format for tracking grating profile dimensions and shape characteristics as a function of time. The display elements includes the time a grating profile data was gathered 300, various grating critical dimension ratios such as top width/bottom width 310 and total height/top width 320, other dimensions such as top width 330, and profile shape data such profile label 340, profile graphic image 350, and an alert 360 message if a grating profile exceeds the acceptable ranges established for the application. In addition to the above type of data analysis, the grating profile dimension and shape data are collected and subsequently processed where statistical techniques are utilized to find the distribution of profiles in fabrication runs and or correlate the profile shapes and or dimensions to the input fabrication parameters.

Although the clustering technique described in one embodiment employs the non-hierarchical Gonzales algorithm, any clustering method may be employed such as single link (including the SLINK and minimal tree spanning algorithms), complete link, group average link, Voorhees algorithm for group average link, and Ward's method (including the reciprocal nearest neighbor algorithm for Ward's method). Other algorithms such as simulated annealing described in S. Kirkpatrick, C. D. Gellatt and M. P. Vecchi, "*Optimization by simulated annealing*", Science 220, 4598 (May), 671–680, 1983, incorporated by reference, or gradient decent methods may be employed to solve the min-max problem, in lieu of the Gonzales algorithm. Further, any min-max clustering algorithm may be employed in lieu of the T. Gonzalez algorithm, such as the one described in the paper by T. Feder and D. Greene, *Optimal Algorithms for Approximate Clustering*, Proceedings of the 20th ACM Symposium on Theory of Computing (STOC), pp. 434–444 (1988), incorporated by reference herein.

In addition, although the Euclidean distance is the preferred metric for calculating the distance between points, any metric may be used, where appropriate, without detracting from the invention. Furthermore, though a series of circles, spheres or hyper spheres may be envisioned as the geometry defining a particular cluster, any particular geometry and any particular topology may be used.

Depending on the language used to construct and implement the software (which could be any language, such as C, C++, Perl, Java or the like), the software may have any number of classes, functions, objects, variables, templates, lines of code, portions of code and constructs (collectively and generally, "a process step", "step", "block", "software process", "functional module" or "software module") to carry out the invention in successive stages as described and taught herein, and may be either a stand-alone software application, or employed inside of or called by another software application. The software process or software module may be constructed so that one portion of code in the application performs a plurality of functions, as for instance in Object Oriented programming (e.g., an overloaded particular, it is contemplated that functional implementation of invention described herein may be implemented equivalently in hardware, software, firmware, and/or other available functional components or building blocks.

Other variations and embodiments are possible in light of above teachings, and it is thus intended that the scope of invention not be limited by this Detailed Description, but rather by claims following.

TABLE 1

Grating profile library showing one profile label "Trapezoid A" for the first 100 instances belonging to cluster 1 and "Trapezoid B" for the next 100 profile belonging to cluster 2.

| Profile No. | Footing bottom width, w1 | Trapezoidal Bottom Width, w2 | Total height h | Trapezoidal top width, w3 | Rounding Top Width, w4 | Profile Label |
|---|---|---|---|---|---|---|
| 1 | 5.0 nm | 4.5 nm | 10.0 nm | 4.0 nm | 3.0 nm | Trapezoid Ftng A |
| 2 | 5.0 nm | 4.5 nm | 10.0 nm | 4.0 nm | 3.1 nm | Trapezoid Ftng A |
| 3 | 5.0 nm | 4.5 nm | 10.0 nm | 4.1 nm | 3.2 nm | Trapezoid Ftng A |
| ... | ... | ... | ... | ... | ... | ... |
| 99 | 5.0 nm | 4.5 nm | 10.0 nm | 4.4 nm | 3.1 nm | Trapezoid Ftng A |
| 100 | 5.0 nm | 4.5 nm | 10.0 nm | 4.5 nm | 3.2 nm | Trapezoid Ftng A |
| 101 | 6.0 nm | N/A | 9.0 nm | 4.0 nm | 2.8 nm | Trapezoid Round B |
| 102 | 6.0 nm | N/A | 9.0 nm | 4.0 nm | 2.8 nm | Trapezoid Round B |
| ... | ... | ... | ... | ... | ... | ... |

TABLE 2

First three and the last two records of a cluster file comprising 10,000 cluster records.

| Cluster No. | Footing bottom width, w1 | Trapezoidal Bottom Width, w2 | Total height, h | Trapezoidal top width, w3 | Rounding Top Width, w4 | Cluster Profile Label | Cluster Profile Graphical Image | Cluster Profile Description |
|---|---|---|---|---|---|---|---|---|
| 1 | 5.0 nm | 4.5 nm | 10.0 nm | 4.0 nm | 3.0 nm | Trapezoid Ftng A | Bit Map Trapezoid Ftng A | Trapezoid, total height is 2× bottom width, rounded top, footing A |
| 2 | 5.0 nm | 4.6 nm | 11.0 nm | 4.5 nm | 3.5 nm | Trapezoid Ftng B | Bit Map Trapezoid Ftng B | Trapezoid, total height is 2× bottom width, rounded top, footing B |
| 3 | 5.0 nm | 4.7 nm | 12.0 nm | 5.0 nm | 3.8 nm | Trapezoid Ftng C | Bit Map Trapezoid Ftng C | Trapezoid, total height is 2× bottom width, rounded top, footing C |
| ... | ... | ... | ... | ... | ... | ... | ... | ... |
| 9999 | 5.0 nm | N/A | 10.0 nm | 4.5 nm | 3.0 nm | Trapezoid Round A | Bit Map Trapezoid Round A | Trapezoid, total height is 2× bottom width, rounded top A |
| 10000 | 5.0 nm | N/A | 11.0 nm | 5.0 nm | 3.2 nm | Trapezoid Round B | Bit Map Trapezoid Round B | Trapezoid, total height is 2× bottom width, rounded top B | process). The converse is also true, in that a plurality of portions of code could perform a plurality of functions, and still be functionally the same as a single portion of code. At any stage of the process step of the present invention, intermediate values, variables and data may be stored for later use by the program.

Foregoing described embodiments of the invention are provided as illustrations and descriptions. They are not intended to limit the invention to precise form described. In

What is claimed is:

1. A system for classifying grating profile data, the system comprising:
    a grazing profile data space containing grating profile data points and a cluster generator;
    wherein the cluster generator, upon activation, generates a plurality of clusters of grating profile data points from the data space containing grating profile data points by utilizing a clustering algorithm, the cluster generator associating profile shape data to each cluster of the plurality of clusters of grating profile data points, and the cluster generator linking the associated profile shape data to the grating profile data points belonging to each cluster of the plurality of grating profile data points.

2. The grating profile classification system of claim 1, further comprising a requestor device for requesting the cluster generator to classify the profile data space based on request parameters.

3. The grating profile classification system of claim 2, wherein the request parameters include the number of clusters for the plurality of clusters of grating profile data points.

4. The grating profile classification system of claim 2, wherein the requestor device transmits the request to the cluster generator utilizing a network.

5. The grating profile classification system of claim 1, wherein the grating profile data space containing profile data points comprises a library of grating profiles.

6. The grating profile classification system of claim 1, wherein the clustering algorithm is the Gonzales algorithm.

7. The grating profile classification system of claim 1, wherein the profile shape data comprises a profile shape label, a profile shape graphical image, and a profile shape description.

8. A system for evaluating grating profile data, the system comprising:
   a profile cluster database for storing the profile shape data for a cluster of profiles;
   a library of grating profiles for storing profile instances consisting of profile dimensions, spectrum data, and a profile label; and
   a profile shape evaluator, coupled to the profile cluster database and to the library of grating profiles;
   where the profile shape evaluator, upon being activated, accesses the library profile data from a grating profile library instance selected as the closest match to an input grating profile, the profile shape evaluator comparing the library profile data with a set of acceptable ranges of library profile data for the application and flagging the input grating profile if the library profile data is outside the set of acceptable ranges of profile data forte application or flagging the input grating profile if the library profile data is within the set of acceptable ranges of profile data for the application.

9. The grating profile evaluation system of claim 8 further comprising an output device for presenting the profile evaluation display showing a profile shape image and or a two-dimensional graph of key profile dimensions of the selected library instance and or an alert identifying to input grating profile as exceeding the set of acceptable ranges of profile data for the application.

10. A computerized display for presenting grating evaluation data, the display format comprising:
    a set of grating profile dimensions and calculated values derived from clustering the grating profile data points dimensions representing a grating profile;
    a profile label associated with the set of grating profile dimensions;
    a profile graphic image associated with the set of grating profile dimensions;
    a profile description; and
    an alert flag.

11. A computer storage medium storing the computer readable code for causing a computer to execute the steps of a method for classifying grating profile data, the method comprising:
    requesting creation of grating profile data from a grating profile data space consisting of grating profile data points;
    determining a number of clusters for the grating profile data space;
    clustering the grating profile data points into the number of clusters of the grating profile data space; and
    associating profile shape data to each cluster of grating profile data points.

* * * * *